United States Patent
Junker et al.

(10) Patent No.: US 12,197,419 B2
(45) Date of Patent: Jan. 14, 2025

(54) CONSISTENCY CHECKS FOR COMPRESSED DATA

(71) Applicant: SAP SE, Walldorf (DE)

(72) Inventors: Frederic Junker, Walldorf (DE); Christian Lemke, Karlsruhe (DE); Sebastian Seifert, Heidelberg (DE)

(73) Assignee: SAP SE, Walldorf (DE)

( * ) Notice: Subject to any disclaimer, the term of this patent is extended or adjusted under 35 U.S.C. 154(b) by 45 days.

(21) Appl. No.: 17/974,209

(22) Filed: Oct. 26, 2022

(65) Prior Publication Data

US 2024/0086392 A1    Mar. 14, 2024

Related U.S. Application Data (60) Provisional application No. 63/406,596, filed on Sep. 14, 2022.

(51) Int. Cl.
*G06F 17/00* (2019.01)
*G06F 16/23* (2019.01)
*H03M 7/40* (2006.01)

(52) U.S. Cl.
CPC .......... *G06F 16/2365* (2019.01); *H03M 7/40* (2013.01)

(58) Field of Classification Search
CPC ........ G06F 16/13; G06F 16/24; G06F 16/156; G06N 3/00; G06N 5/00; G05B 13/00
See application file for complete search history.

(56) References Cited

U.S. PATENT DOCUMENTS

| | | | | |
|---|---|---|---|---|
| 6,633,673 | B1* | 10/2003 | Shen | H04N 19/90 375/E7.199 |
| 6,965,897 | B1* | 11/2005 | Chen | H03M 7/30 707/999.102 |
| 9,965,570 | B2* | 5/2018 | Chen | G06F 16/90344 |
| 10,756,759 | B2* | 8/2020 | Lahiri | G06F 16/221 |
| 11,048,590 | B1* | 6/2021 | Sapuntzakis | G06F 3/065 |
| 11,256,558 | B1* | 2/2022 | Gladwin | G06F 11/1088 |
| 11,442,921 | B1* | 9/2022 | Abhijeet | G06F 16/2365 |
| 2005/0179569 | A1* | 8/2005 | Cockburn | H03M 7/3086 341/51 |
| 2006/0133187 | A1* | 6/2006 | Fekih-Romdhane | G11C 29/40 365/230.09 |
| 2007/0061544 | A1* | 3/2007 | Uppala | G06F 16/221 711/173 |
| 2007/0136346 | A1* | 6/2007 | Morris | G06F 16/24561 |
| 2008/0172525 | A1* | 7/2008 | Nakamura | G06F 12/0873 711/E12.019 |

(Continued)

*Primary Examiner* — Hung D Le
(74) *Attorney, Agent, or Firm* — Buckley, Maschoff & Talwalkar LLC (57) ABSTRACT

Systems and methods include reception of an instruction to perform a consistency check on compressed column data. In response to the instruction, a compression algorithm applied to uncompressed column data to generate the compressed column data is determined, one or more consistency checks associated with the compression algorithm are determined, wherein a first one or more consistency checks associated with a first compression algorithm are different from a second one or more consistency checks associated with a second compression algorithm, the one or more consistency checks are executed on the compressed column data, and, if the one or more consistency checks are not satisfied, a notification is transmitted to a user.

18 Claims, 7 Drawing Sheets

(56) References Cited

U.S. PATENT DOCUMENTS

| | | | |
|---|---|---|---|
| 2008/0294676 A1* | 11/2008 | Faerber | G06F 16/2237 707/999.102 |
| 2009/0112889 A1* | 4/2009 | Lee | H04L 49/90 |
| 2009/0196513 A1* | 8/2009 | Tian | H04N 19/60 382/232 |
| 2010/0161567 A1* | 6/2010 | Makela | G06F 16/24561 707/693 |
| 2010/0278446 A1* | 11/2010 | Ganesh | G06F 16/221 382/243 |
| 2010/0328115 A1* | 12/2010 | Binnig | G06F 16/24557 341/51 |
| 2013/0151568 A1* | 6/2013 | Ellison | G06F 16/221 707/802 |
| 2014/0043491 A1* | 2/2014 | Jiang | G06V 20/52 348/180 |
| 2014/0279960 A1* | 9/2014 | Marwah | G06F 16/221 707/703 |
| 2014/0372389 A1* | 12/2014 | Barber | G06F 16/221 707/693 |
| 2015/0074066 A1* | 3/2015 | Li | G06F 16/221 707/693 |
| 2015/0178945 A1* | 6/2015 | Haimi-Cohen | G06V 10/7715 382/107 |
| 2015/0363456 A1* | 12/2015 | Raman | G06F 16/282 707/693 |
| 2017/0371973 A1* | 12/2017 | Finlay | G06F 16/2282 |
| 2018/0150494 A1* | 5/2018 | Schulze | G06F 16/221 |
| 2019/0044475 A1* | 2/2019 | Jeon | H02S 30/20 |
| 2019/0268017 A1* | 8/2019 | Gopal | H04L 1/0057 |
| 2019/0341930 A1* | 11/2019 | Pavlovic | H03M 7/3088 |
| 2020/0097571 A1* | 3/2020 | Mathur | G06F 16/2282 |
| 2020/0110820 A1* | 4/2020 | Fender | H03M 7/3088 |
| 2020/0125751 A1* | 4/2020 | Hariharasubrahmanian | H04L 9/3247 |
| 2020/0320213 A1* | 10/2020 | Fuhry | G06F 21/6227 |
| 2020/0336154 A1* | 10/2020 | Ovsiannikov | G06F 9/30145 |
| 2020/0387488 A1* | 12/2020 | Wagle | G06F 12/0246 |
| 2021/0042292 A1* | 2/2021 | Gentric | G06F 9/30036 |
| 2021/0073221 A1* | 3/2021 | Chavan | G06F 9/3887 |
| 2021/0073233 A1* | 3/2021 | Chavan | G06F 16/2246 |
| 2021/0303753 A1* | 9/2021 | Rogowski | H04N 19/70 |
| 2022/0075843 A1* | 3/2022 | Kumar | G06N 3/04 |
| 2022/0138044 A1* | 5/2022 | Luo | H03M 13/6318 714/764 |
| 2022/0269669 A1* | 8/2022 | Parmar | G06F 16/182 |
| 2022/0318223 A1* | 10/2022 | Ahluwalia | G06F 16/24552 |
| 2023/0075667 A1* | 3/2023 | Gopal | G06F 9/3808 |
| 2023/0152972 A1* | 5/2023 | Shoji | G06F 3/0659 711/154 |
| 2023/0281174 A1* | 9/2023 | Madan | G06F 16/215 707/692 |

* cited by examiner

CONSISTENCY CHECKS FOR COMPRESSED DATA

CROSS-REFERENCE TO RELATED APPLICATIONS

This application claims the benefit of, and priority to, U.S. Provisional Patent Application No. 63/406,596, filed Sep. 14, 2022, the contents of which are incorporated by reference for all purposes.

BACKGROUND

Conventional database systems store large amounts of data in the form of database tables. To reduce the amount of memory required to store the database tables, the data of a database table is often compressed and stored in a compressed format. Algorithms used for such compression include but are not limited to prefix encoding, run length encoding, linear run length encoding, sparse encoding, cluster encoding, and indirect encoding. Compression algorithms may be applied to a table column dictionary and to a data vector representing a value of each row of a column. The various compression algorithms provide different trade-offs between compression ratio and read/write access performance for different data distributions.

These compressed data structures may become corrupted due to various causes such as hardware failures (e.g., a scratch on a hard drive), database system programming errors which result in overwriting of data at incorrect memory locations which happen to coincide with memory locations storing binary data representing database table content, and data compression programming errors which result in incorrectly-compressed data. Such corruptions may lead to incorrect query result sets, degraded performance of database queries, or poor automated performance decisions.

Conventionally, such corruptions/errors are detected only after resulting detrimental effects become obvious, if at all. If detected, correct data could be restored using savepoints and undo/redo logs or backups. However, such an approach does not address unknown consequences occurring while the corruptions/errors remain undetected, consumes substantial time and resources due to the duration of the undo/redo log history being applied, and might lead to situations where newly-inserted data is lost.

What is needed are efficient systems to proactively identify corruption or other error within binary compressed data structures.

DETAILED DESCRIPTION

The following description is provided to enable any person in the art to make and use the described embodiments. Various modifications, however, will remain readily-apparent to those in the art.

The binary compressed data structures resulting from each compression algorithm mentioned above necessarily satisfy certain mathematical criteria if the compression algorithm is performed correctly. Accordingly, some embodiments determine whether compressed data representing the data values of a column satisfies the criteria which correspond to the compression algorithm that was used to compress the data values.

The application of the compression algorithm and the performance of the consistency checks may be triggered by separate instructions, in between which hardware failures or bugs overwriting random memory, for example, may introduce inconsistencies.

Figure 1:
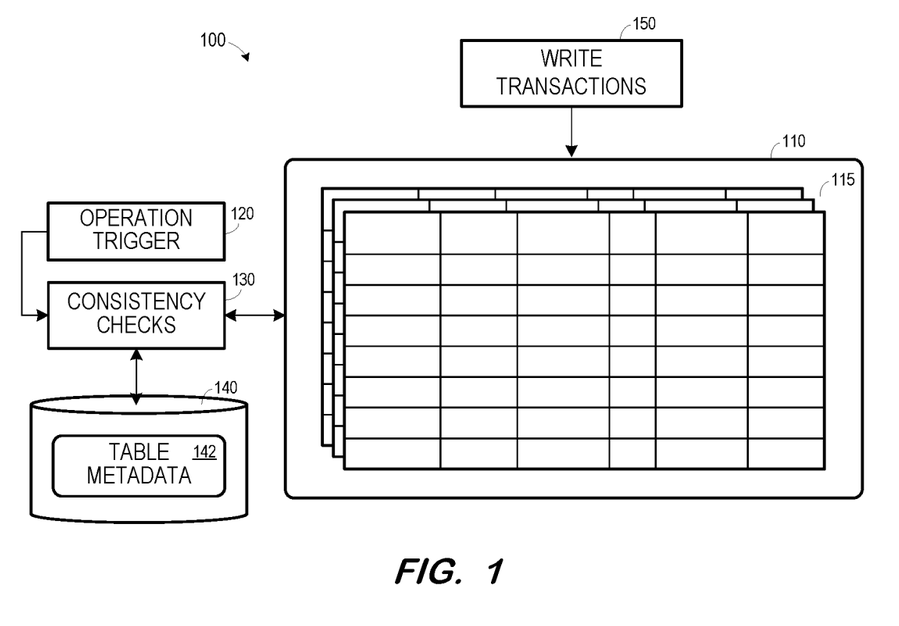
FIG. 1 is a logical block diagram of a system according to some embodiments.

FIG. 1 is a logical block diagram of system 100 according to some embodiments. The illustrated elements of system 100 may be implemented using any suitable combination of computing hardware and/or software that is or becomes known. In some embodiments, two or more elements of system 100 are implemented by a single computing device. One or more elements of system 100 may be implemented by an on-premise system and/or using cloud-based resources.

Data store 110 stores database tables 115. Data store 110 may comprise an "in-memory" columnar data store in which the data of each column of each of database tables 115 is stored in contiguous random access memory addresses as is known in the art. Moreover, the data of each column of each of database tables 115 may be stored within data store 110 in a compressed format based on a specified compression algorithm according to some embodiments. The compression algorithm used to compress the data values of one column may differ from the compression algorithm used to compress the data values of another column, even if the two columns reside in a same database table 115.

Metadata store 140 stores table metadata 142 in addition to other metadata used during operation of system 100. Table metadata 142 may define each of tables 115 and their interrelationships, their columns, their column types, and compression algorithms currently used to compress the data of each column within data store 110. Metadata store 140 may also be implemented by random access memory in some embodiments.

During operation of system 100, write transactions 150 are received from database clients such as users and/or database applications. Write transactions 150 consist of commands such as but not limited to Data Manipulation Language (DML) statements (e.g., insert, delete, update) which change the data of database tables 115. At some point during operation, operation trigger component 120 determines to execute consistency checks on database tables 115. The determination may be based on a periodic monitoring schedule, a command received from a database administrator, or otherwise. In response, operation trigger component 120 instructs consistency checks component 130 to execute consistency checks on database tables 115 as described herein. Consistency checks component 130 may perform consistency checks other than those described herein, and in response to other triggers.

The column data to which a compression algorithm is applied as described herein may be dictionary-encoded and bit-compressed prior to application of the compression algorithm. Dictionary encoding and bit compression will now be described.

Each record of a database table includes several values, one for each column of the table. The amount of memory required to store these values may be reduced by storing value IDs instead of the values themselves. In order to facilitate such storage, a dictionary is used which maps values into value IDs. Each unique value in the dictionary is associated with one unique value ID. Therefore, when a particular value is to be stored in a database record, the value ID for the value is determined from the dictionary and the value ID is stored in the record instead.

Figure 2A:
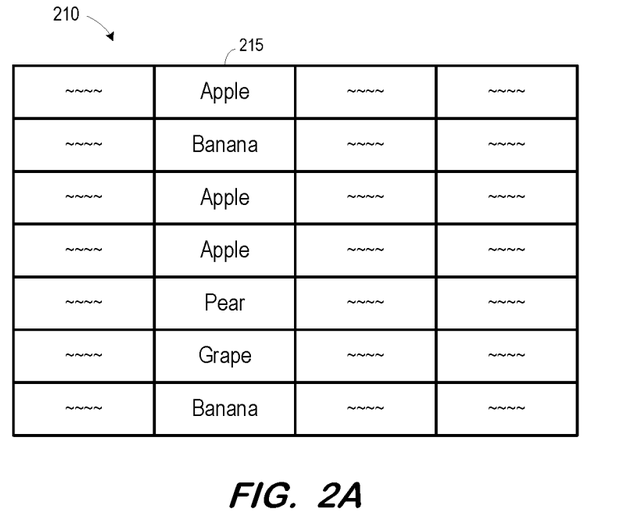
FIG. 2A illustrates a database table according to some embodiments.
Figure 2B:
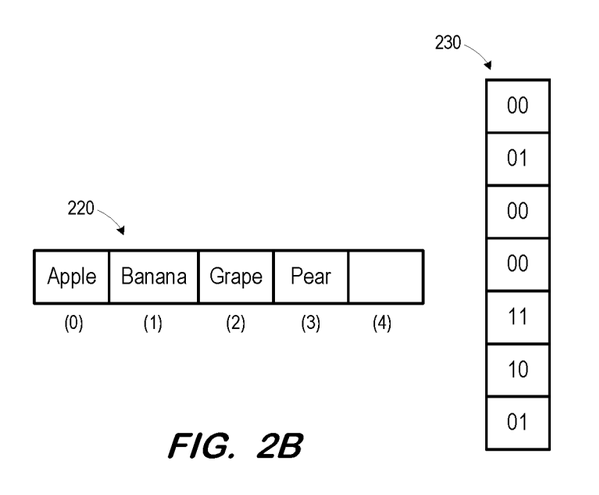
FIG. 2B illustrates a data dictionary and a column vector according to some embodiments.

In one example, FIG. 2A illustrates table 210. Table 210 includes four columns, each of which includes various values. Dictionary 220 of FIG. 2B is associated with column 215 and is used for encoding the values of column 215 as described above. Each other column of table 210 may be associated with a respective (unshown) dictionary.

Each vector element at position i of dictionary 220 stores the value associated with value ID i. That is, value "Pear" is associated with value ID 1, value "Banana" is associated with value ID 1, etc. Dictionary 220 may be sorted alphabetically and re-sorted each time a value not currently present in dictionary 220 is added to column 215 and therefore also added to dictionary 220. A sorted dictionary is suitable for storage of columnar data (e.g., since it supports direct binary search and does not require the overhead of a dictionary index) and for reading of columnar data (e.g., since range queries are executed directly on integer values, rather than comparison of actual values which may consist of long strings). Conversely, a sorted dictionary is not ideal for inserting new values into columnar data (e.g., since new values do not arrive in order and the dictionary would therefore require constant re-sorting).

Vector 230 represents the rows of column 215 after being encoded based on dictionary 220 (i.e., "dictionary-encoded") and bit-compressed. Since dictionary 220 includes only four values, only two binary bits are needed to encode the values. The use of two bits per value (i.e., the minimum needed to represent all values of dictionary 220) is referred to as bit-compression.

As shown, each occurrence of value "Apple" in column 215 has been replaced by value ID 00 in vector 230, each occurrence of value "Banana" has been replaced by value ID 01, each occurrence of value "Grape" has been replaced by value ID 10, and each occurrence of value "Pear" has been replaced by value ID 11. If column 215 included a fifth value (e.g., "Watermelon", in an unshown row), then three binary bits would be needed to encode the values of dictionary 220 and vector 230 would read 000, 001, 000, 000, 011, 010 and 001.

Advantageously, storage of the values of vector 230 requires less storage space than storage of the actual values of column 215, and the stored values of vector 230 are more amenable to the further compression described herein. In this regard, the consistency checks described below are applied to data vectors such as vector 230 on which advanced compressed has been applied.

In addition to a data vector, each column may be associated with a secondary structure, or dictionary index, which is used to quickly determine rows of a column which contain a particular dictionary value. The dictionary index may be, for example, a hash map or tree-based map from value to value ID. Accordingly, the data of a column may be represented by three data structures, a data (or index) vector, a dictionary, and a dictionary (or inverted) index. The consistency checks described herein are applied to a data vector which has been subjected to compression in addition to the above-described dictionary encoding and bit-compression. This additional compression, which may include prefix encoding, run length encoding, cluster encoding, sparse encoding, and indirect encoding, is referred to herein as "advanced" compression.

Figure 3:
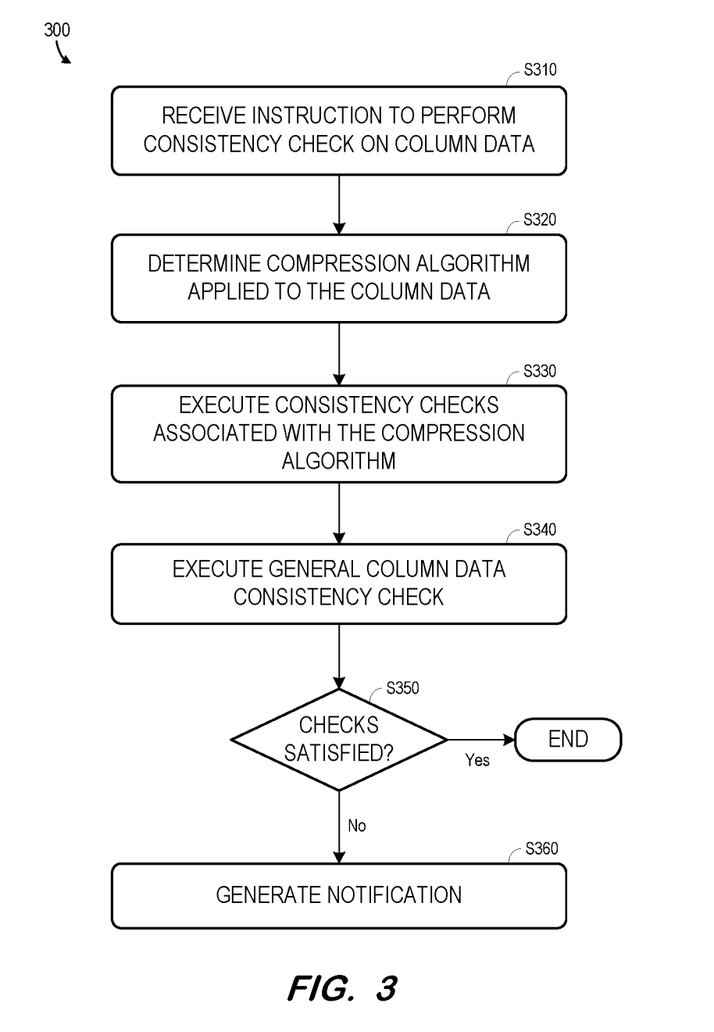
FIG. 3 comprises a flow diagram of a process to optimize compression of columnar database table data at runtime according to some embodiments.

FIG. 3 comprises a flow diagram of process 300 to execute consistency checks according to some embodiments. In some embodiments, various hardware elements execute program code to perform process 300. Process 300 and other processes described herein may be executed by a database system using any suitable combination of hardware and software. Software program code embodying these processes may be stored by any non-transitory tangible medium, including a fixed disk, a volatile or non-volatile random-access memory, a DVD, a Flash drive, and a magnetic tape, and executed by any suitable processing unit, including but not limited to one or more programmable microprocessors, microcontrollers, processing cores, and processor threads. Embodiments are not limited to the examples described below.

Initially, at S310, an instruction to perform a consistency check on column data (i.e., a data (index) vector) is received. The instruction may be issued by a triggering component in response to loading of the column from persistence into memory, in response to expiration of a predetermined (configurable) time period, or in response to an administrator command, for example.

The compression algorithm applied to the column data is determined at S320. In some embodiments, table metadata 142 specifies an advanced compression algorithm for each column of each of database tables 115. Table metadata 142 may be accessed at S320 to determine the compression algorithm applied to the column data.

FIGS. 4A through 4E illustrate various advanced compression algorithms that may be determined at S320 according to some embodiments. The compression algorithms include prefix encoding (e.g., FIG. 4A), run length encoding (e.g., FIG. 4B), cluster encoding (e.g., FIG. 4C), sparse encoding (e.g., FIG. 4D), and indirect encoding (e.g., FIG. 4E), but embodiments are not limited thereto. As shown, each compression algorithm other than prefix encoding uses two or more binary data structures to represent a dictionary- and bit-compressed data vector.

Figure 4A:
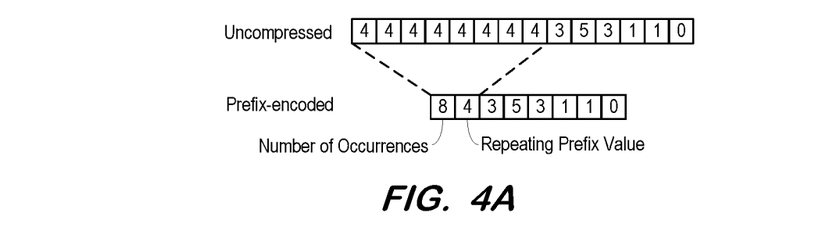
FIGS. 4A through 4E illustrate advanced compression algorithms according to some embodiments.

At S330, consistency checks associated with the determined compression algorithm are determined and executed. If no consistency checks are specifically associated with the determined compression algorithm, flow proceeds to S340 without performing any compression algorithm-specific consistency checks at S330. In the current example, no consistency checks are specifically associated with prefix encoding as illustrated in FIG. 4A.

Figure 4B:
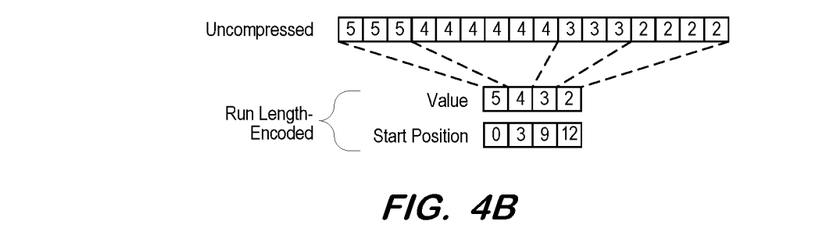

If the determined compression algorithm is run length encoding as shown in FIG. 4B, the consistency checks executed at S330 include checking the compressed "Value" data structure to confirm that the values of any two consecutive runs are distinct. Also, the "Start Position" data structure is checked to ensure that the start position of each run increases strictly monotonously. The start position of the last run (i.e., 12 in FIG. 4B) is also checked to determine whether it is lower than the total number of values in the uncompressed column data (i.e., 16 in FIG. 4B).

Figure 4C:
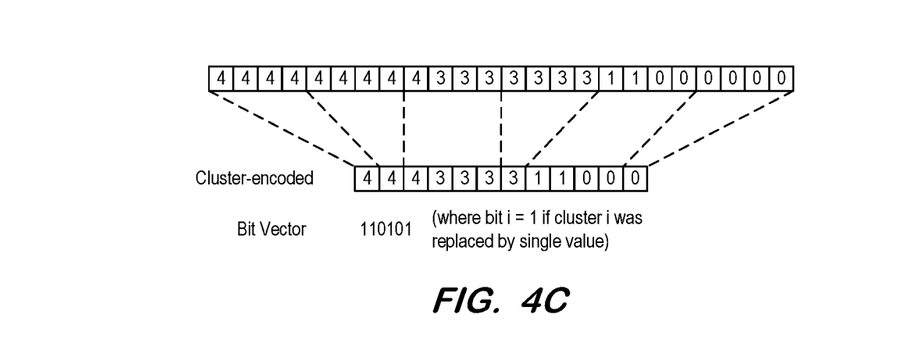

As shown in FIG. 4C, cluster encoding maintains a Bit Vector indicating which clusters are compressed and which are not. If the determined compression algorithm is cluster encoding, the consistency checks executed at S330 include confirming whether the number of uncompressed values represented by the Bit Vector matches the number of uncompressed values in the column data. In the present example, each bit of the Bit Vector represents four uncompressed values so the Bit Vector '110101' represents twenty-four uncompressed values. It may also be confirmed whether the number of compressed values represented by the Bit Vector matches the number of compressed values in the Cluster-encoded data. In the present example, each '1' bit of the Bit Vector represents one compressed value and each '0' bit of the Bit Vector represents four uncompressed values so the Bit Vector '110101' represents twelve compressed values.

Moreover, it is determined at S330 whether all clusters that could be compressed actually were compressed, i.e., no more than one cluster-size (e.g., 1024) of consecutive values are identical (considering the offset/multiples determining cluster boundaries). Although not shown in FIG. 4C, cluster encoding may maintain a Positions vector in order to speed up read access to values. The positions stored by this vector are checked to confirm that they increase monotonously and are within the range of the number of values stored by the Cluster-encoded data.

Figure 4D:
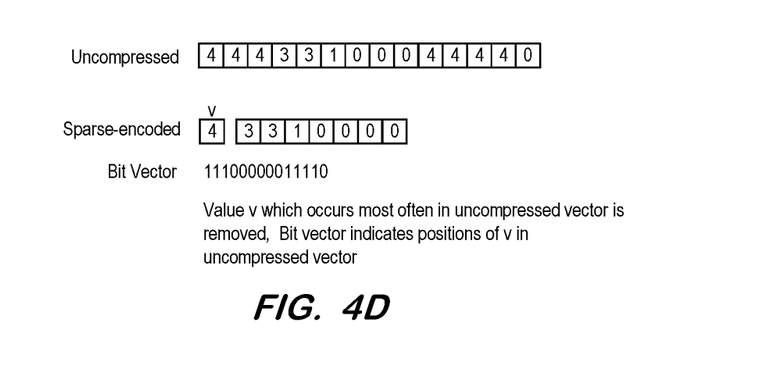

If the determined compression algorithm is sparse encoding, the consistency checks executed at S330 determine whether any value occurs more frequently than value v designated as the most frequent value (i.e., 4 in FIG. 4D). A check is also executed to confirm that the most frequent value v does not occur in the Sparse-encoded vector. In order to speed up read access to values other than the most frequent value, sparse encoding may maintain a positions vector. S330 may therefore include confirming that the positions contained in the positions vector increase monotonously. The increase need not be strictly monotonous, in that consecutively-stored positions may be identical. Also, as in the case with cluster encoding, each position stored by the positions vector must be within the range of the number of values in the compressed data.

Figure 4E:
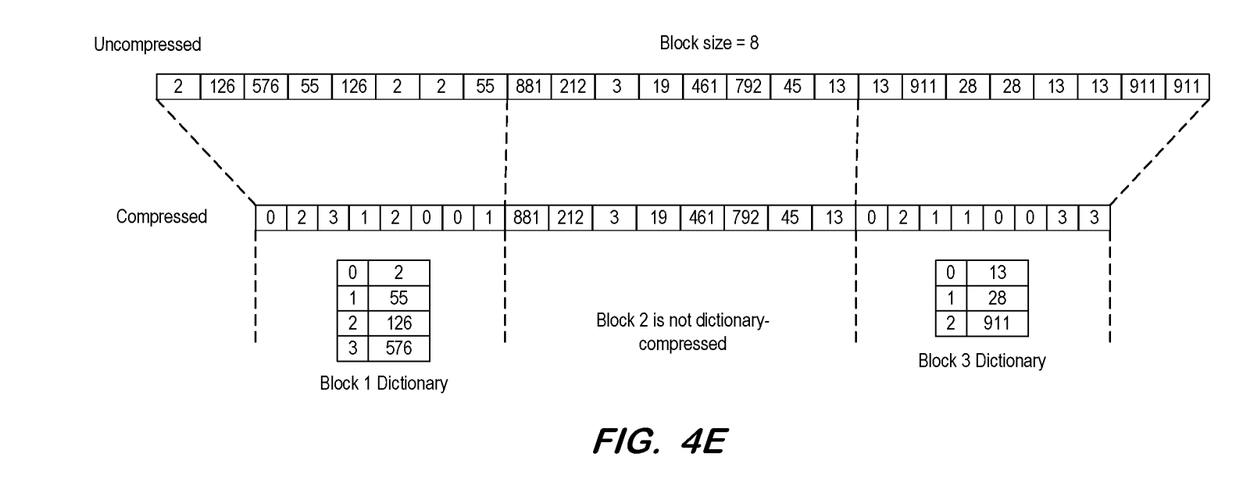

If the determined compression algorithm is indirect encoding, a check is executed to confirm that each block contains each value of its respective dictionary at least once. If one dictionary is used for multiple consecutive blocks rather than for one block only, then a check is also executed to confirm that this arrangement consumes less memory than a case in which a separate dictionary is used for each of the consecutive blocks.

Some consistency checks may be executed regardless of the type of applied compression algorithm. These "general" consistency checks are executed at S340. For example, S340 may include checking that none of the values occurring in the compressed data structures is larger than the size of the dictionary associated with the column. Also, it is checked that each value between 0 and (dictionary size—1) occurs at least once among the compressed data structures, and that the number of values represented by a compressed data structure is not larger than the maximum permitted size of a column data vector.

At S350, it is determined whether all executed consistency checks have been satisfied (i.e., whether the advanced-compressed column data "passed" all the consistency checks). If so, the results of the consistency checks may be logged and flow terminates. If not, a notification is generated at S360. The notification may indicate that data is inconsistent/incorrect/corrupted and may specify the name(s) of the column and/or table which includes the inconsistent/incorrect/corrupted data. The notification may be transmitted to a database administrator, user, owner of the column data, and/or other party.

In response to the notification, the correct data can be restored using savepoints and undo/redo logs. The redo logs are applied from the most recent savepoint which does not contain include the inconsistency. Application of the redo logs may be less time-consuming than prior systems in which the inconsistencies are not proactively identified because the size of the undo/redo log history to be applied is smaller.

Figure 5:
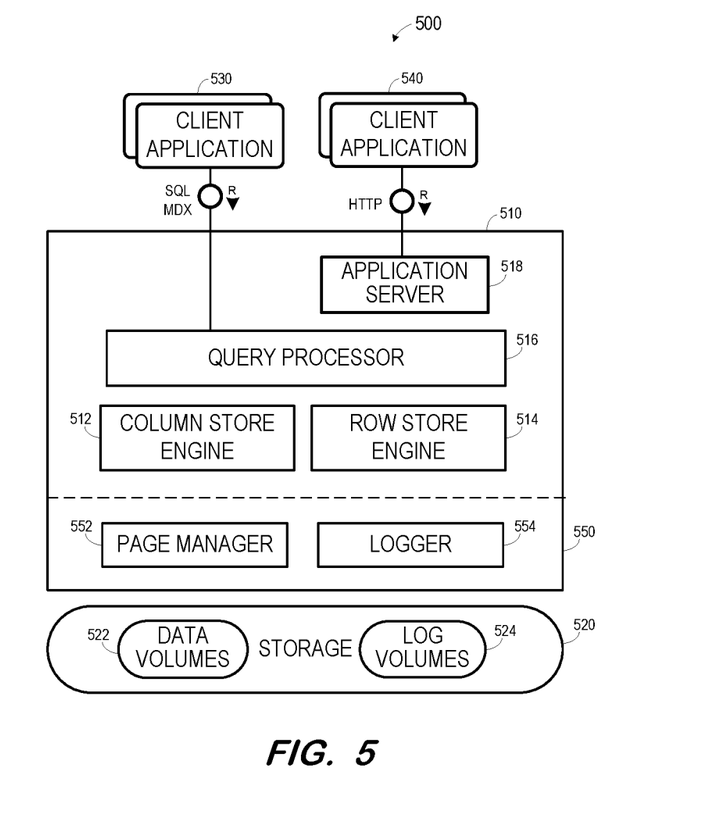
FIG. 5 is a block diagram of a database architecture according to some embodiments.

FIG. 5 is a block diagram of an implementation of database architecture 500 according to some embodiments. Embodiments are not limited to the illustrated elements of FIG. 5. The illustrated elements may be implemented by any suitable combinations of hardware and software as is known in the art. Such combinations may include one or more programmable processors (microprocessors, central processing units, microprocessor cores, execution threads), one or more non-transitory storage media, and processor-executable program code.

Database system 510 may comprise any query-responsive database system that is or becomes known, including but not limited to a structured-query language (i.e., SQL) relational database management system. Database system 510 may comprise an "in-memory" database, in which Random Access Memory is used as a cache and for storing the full database during operation.

Database system 510 includes column store engine 512. Column store engine 512 manages tabular data of a database as is known in the art. Data managed by column store engine 512 or by row store engine 514 may be stored using advanced compression as described and may be retrieved or modified in response to requests received from query processor 516. Query processor 516, in turn, may receive queries received from applications executing on application server 518 and in communication with client applications 540, or directly from client applications 530.

Persistence layer 550 include page manager 552 to control storage 520 (e.g., a disk-based filesystem) for writing to and reading from data volumes 522 and log volumes 524 stored thereon. Storage 520 may comprise one or more non-volatile data storage units (e.g., fixed disks) storing relational data, multi-dimensional data, or any other structured and/or unstructured data.

Although system 510 reflects a "single node" database system, embodiments may also be implemented within one or more nodes of a distributed database, each of which comprises an executing process, a cache and a datastore. The data stored in the datastores of each node, taken together, represent the full database, and the database server processes of each node operate to transparently provide the data of the full database to the aforementioned database applications. System 510 may also or alternatively support multi-tenancy by providing multiple logical database systems which are programmatically isolated from one another.

Figure 6:
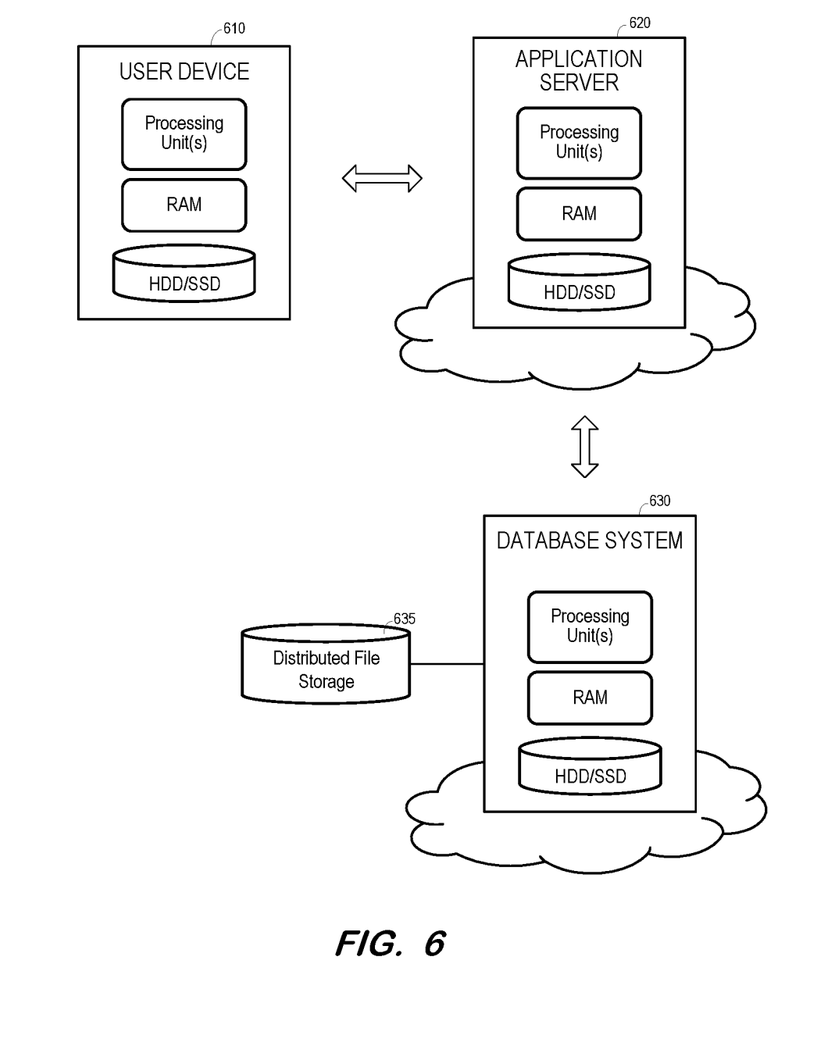
FIG. 6 is a block diagram of a cloud-based database architecture according to some embodiments.

FIG. 6 illustrates a cloud-based database deployment according to some embodiments. The illustrated components may reside in one or more public clouds providing self-service and immediate provisioning, autoscaling, security, compliance and identity management features.

User device 610 may interact with applications executing on application server 620, for example via a Web Browser executing on user device 610, in order to create, read, update and delete data managed by database system 630 and persisted in distributed file storage 635. Database system 630 may store compressed columnar data as described herein and may execute consistency checks of such columnar data. Application server 620 and/or database system 630 may comprise cloud-based compute resources, such as virtual machines, allocated by a public cloud provider. As such, application server 620 and database system 630 may exhibit demand-based elasticity.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of system 100 may include a programmable processor to execute program code such that the computing device operates as described herein.

All systems and processes discussed herein may be embodied in program code stored on one or more non-transitory computer-readable media. Such media may include, for example, a DVD-ROM, a Flash drive, magnetic tape, and solid-state Random Access Memory (RAM) or Read Only Memory (ROM) storage units. Embodiments are therefore not limited to any specific combination of hardware and software.

Elements described herein as communicating with one another are directly or indirectly capable of communicating over any number of different systems for transferring data, including but not limited to shared memory communication, a local area network, a wide area network, a telephone network, a cellular network, a fiber-optic network, a satellite network, an infrared network, a radio frequency network, and any other type of network that may be used to transmit information between devices. Moreover, communication between systems may proceed over any one or more transmission protocols that are or become known, such as Asynchronous Transfer Mode (ATM), Internet Protocol (IP), Hypertext Transfer Protocol (HTTP) and Wireless Application Protocol (WAP).

Embodiments described herein are solely for the purpose of illustration. Those in the art will recognize other embodiments may be practiced with modifications and alterations to that described above.

What is claimed is:

1. A system comprising:
   at least one processing unit; and
   a non-transitory machine-readable medium storing program code that, when executed by the at least one processing unit, cause the at least one processing unit to:
   receive, in response to a request to load a database table column from a persistence into random access memory, an instruction to perform a consistency check on compressed column data of the database table column; and
   in response to the instruction:
      determine a compression algorithm applied to uncompressed column data to generate the compressed column data;
      determine one or more consistency checks associated with the compression algorithm, wherein a first one or more consistency checks associated with a first compression algorithm are different from a second one or more consistency checks associated with a second compression algorithm;
      execute the one or more consistency checks on the compressed column data; and
      if the one or more consistency checks are not satisfied, transmit a notification to a user.

2. A system according to claim 1, wherein execution of the one or more consistency checks on the compressed column data comprises:
   determination of whether any of the values of the compressed column data are larger than a size of a dictionary associated with the column; and
   determination of whether all values between 0 and (dictionary size—1) are present in the compressed column data.

3. A system according to claim 1, wherein the determined compression algorithm is run length encoding, and wherein execution of the one or more consistency checks comprises:
   determination of whether the values of each consecutive run of two values within the compressed column data are different from one another;
   determination of whether values of a start position data structure associated with the compressed column data increase monotonously; and
   determination of whether a last value of the start position data structure is lower than a total number of values in the uncompressed column data.

4. A system according to claim 1, wherein the determined compression algorithm is cluster encoding, and wherein execution of the one or more consistency checks comprises:
   determination of whether the number of uncompressed values represented by a bit vector associated with the compressed column data matches a total number of values in the uncompressed column data; and
   determination of whether the number of compressed values represented by the bit vector matches a total number of values in the compressed column data.

5. A system according to claim 1, wherein the determined compression algorithm is sparse encoding, and wherein execution of the one or more consistency checks comprises:
   determination of whether a designated value associated with the compressed column data occurs less frequently than any other value in the uncompressed column data; and
   determination of whether the designated value occurs in the compressed column data.

6. A system according to claim 1, wherein the determined compression algorithm is indirect encoding, and wherein execution of the one or more consistency checks comprises:
   determination of whether that each block of the compressed column data contains all values of a block dictionary associated with the block.

7. A method comprising:
   receiving, in response to a request to load a database table column from a persistence into random access memory, an instruction to perform a consistency check on compressed column data of the database table column; and
   in response to the instruction:
      determining a compression algorithm applied to uncompressed column data to generate the compressed column data;
      determining one or more consistency checks associated with the compression algorithm, wherein a first one or more consistency checks determined as associated with a first compression algorithm are different from a second one or more consistency checks determined as associated with a second compression algorithm;

executing the determined one or more consistency checks on the compressed column data; and if the one or more consistency checks are not satisfied, generating a notification associated with the column.

8. A method according to claim 7, wherein executing the one or more consistency checks on the compressed column data comprises:

determining whether any of the values of the compressed column data are larger than a size of a dictionary associated with the column; and determining whether all values between 0 and (dictionary size—1) are present in the compressed column data.

9. A method according to claim 7, wherein the determined compression algorithm is run length encoding, and wherein executing the one or more consistency checks comprises:

determining whether the values of each consecutive run of two values within the compressed column data are different from one another;

determining whether values of a start position data structure associated with the compressed column data increase monotonously; and determining whether a last value of the start position data structure is lower than a total number of values in the uncompressed column data.

10. A method according to claim 7, wherein the determined compression algorithm is cluster encoding, and wherein executing the one or more consistency checks comprises:

determining whether the number of uncompressed values represented by a bit vector associated with the compressed column data matches a total number of values in the uncompressed column data; and determining whether the number of compressed values represented by the bit vector matches a total number of values in the compressed column data.

11. A method according to claim 7, wherein the determined compression algorithm is sparse encoding, and wherein executing the one or more consistency checks comprises:

determining whether a designated value associated with the compressed column data occurs less frequently than any other value in the uncompressed column data; and determining whether the designated value occurs in the compressed column data.

12. A method according to claim 7, wherein the determined compression algorithm is indirect encoding, and wherein executing the one or more consistency checks comprises:

determining whether that each block of the compressed column data contains all values of a block dictionary associated with the block.

13. A non-transitory machine-readable medium storing program code that, when executed by at least one processing unit, cause the at least one processing unit to:

receive, in response to a request to load a database table column from a persistence into random access memory, an instruction to perform a consistency check on compressed column data of the database table column; and in response to the instruction:

determine a compression algorithm applied to uncompressed column data to generate the compressed column data;

determine one or more consistency checks associated with the compression algorithm, wherein a first one or more consistency checks associated with a first compression algorithm are different from a second one or more consistency checks associated with a second compression algorithm;

execute the one or more consistency checks on the compressed column data; and if the one or more consistency checks are not satisfied, transmit a notification to a user.

14. A medium according to claim 13, wherein execution of the one or more consistency checks on the compressed column data comprises:

determination of whether any of the values of the compressed column data are larger than a size of a dictionary associated with the column; and determination of whether all values between 0 and (dictionary size—1) are present in the compressed column data.

15. A medium according to claim 13, wherein the determined compression algorithm is run length encoding, and wherein execution of the one or more consistency checks comprises:

determination of whether the values of each consecutive run of two values within the compressed column data are different from one another;

determination of whether values of a start position data structure associated with the compressed column data increase monotonously; and determination of whether a last value of the start position data structure is lower than a total number of values in the uncompressed column data.

16. A medium according to claim 13, wherein the determined compression algorithm is cluster encoding, and wherein execution of the one or more consistency checks comprises:

determination of whether the number of uncompressed values represented by a bit vector associated with the compressed column data matches a total number of values in the uncompressed column data; and determination of whether the number of compressed values represented by the bit vector matches a total number of values in the compressed column data.

17. A medium according to claim 13, wherein the determined compression algorithm is sparse encoding, and wherein execution of the one or more consistency checks comprises:

determination of whether a designated value associated with the compressed column data occurs less frequently than any other value in the uncompressed column data; and determination of whether the designated value occurs in the compressed column data.

18. A medium according to claim 13, wherein the determined compression algorithm is indirect encoding, and wherein execution of the one or more consistency checks comprises:

determination of whether that each block of the compressed column data contains all values of a block dictionary associated with the block.

* * * * *